(12) United States Patent
van Wingerden et al.

(10) Patent No.: US 8,426,928 B2
(45) Date of Patent: Apr. 23, 2013

(54) DEVICE WITH MICROSTRUCTURE AND METHOD OF FORMING SUCH A DEVICE

(75) Inventors: Johannes van Wingerden, Hardinxveld-Giessendam (NL); Greja Johanna Adriana Maria Verheijden, Riethoven (NL); Gerhard Koops, Aalst (BE); Jozef Thomas Martinus van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/916,454

(22) Filed: Oct. 29, 2010

(65) Prior Publication Data

US 2011/0186941 A1  Aug. 4, 2011

(30) Foreign Application Priority Data

Nov. 3, 2009  (EP) .................................. 09174891

(51) Int. Cl.
*H01L 27/14* (2006.01)

(52) U.S. Cl.
USPC ........... 257/414; 257/415; 257/416; 257/417; 257/E29.166; 438/50; 438/53

(58) Field of Classification Search .................. 257/414, 257/415, 416, 417, E29.166; 438/50, 53
See application file for complete search history.

(56) References Cited

U.S. PATENT DOCUMENTS

2004/0061207 A1  4/2004  Ding

2009/0267166 A1  10/2009  Verheijden

FOREIGN PATENT DOCUMENTS

| JP | 2003136499 A | 5/2003 |
|----|--------------|--------|
| WO | 03/046630 A1 | 6/2003 |
| WO | 2004021398 A2 | 3/2004 |

OTHER PUBLICATIONS

Li, Q., et al., "Hermeticity and Thermal Stability Testing of PECVD Silicon Nitride Thin-film Packages", ICEP 2008, International Conference on Electrionics Packaging, Jun. 10, 2008, Tokyo, Japan.

Reuter, et al. "Hermetic thin film encapsulation of mechanical transducers for smart label applications", Transducers, Jun. 21-25, 2009, pp. 208-211.

Nowling, et al., "Remote plasma-enhanced chemical vapour deposition of silicon nitride at atmospheric pressure", Plasma Sources Science and Technology, Institute of Physics Publishing, vol. 11, No. 1, Feb. 2002, pp. 97-103.

Reuter, et al. "Thin film encapsulation technology for harms unsig sacrificialCF-polymer", Sensors and Actuators, vol. 145-146, Jul. 1, 2008, pp. 316-322.

Wah Lee, et al., "Development of a CMOS-compatible electrostatically actuated diaphragm chamber for micropump application", 9th International Conference on Solid-State and Integrated-Circuit Technology, Oct. 20-23, 2008, pp. 1-4.

Extended European Search Report, European Patent Office, Jul. 15, 2010.

*Primary Examiner* — Phat X Cao

(57) ABSTRACT

Disclosed is a device comprising a substrate carrying a microscopic structure in a cavity capped by a capping layer including a material of formula $SiN_xH_y$, wherein $x>1.33$ and $y>0$. A method of forming such a device is also disclosed.

17 Claims, 3 Drawing Sheets

DEVICE WITH MICROSTRUCTURE AND METHOD OF FORMING SUCH A DEVICE

This application claims the priority under 35 U.S.C. §119 of European patent application no. 09174891.3, filed on Nov. 3, 2009, the contents of which are incorporated by reference herein.

FIELD OF THE INVENTION

The present invention relates to a device comprising a substrate carrying a microscopic structure in a cavity capped by a capping layer.

The present invention further relates to a method of manufacturing such a device.

BACKGROUND OF THE INVENTION

The ongoing miniaturization of feature sizes in semiconductor manufacturing processes has facilitated the formation of microscopic structures, i.e. structures that have feature sizes in the micron and submicron, e.g. nanometer domain, on substrates such as silicon substrates. A prime example of such a microscopic structure is a microelectromechanical system (MEMS) structure. Such structures are sometimes also referred to as micromachines.

MEMS structures can be used for a wide range of applications in different fields of technology, e.g. electronics, medicine, pharmacy and chemistry. Applications in the field of electronics for instance include accelerometers, gyroscopes, sensors, and so on. The MEMS structures may be made from any suitable material, e.g. silicon, polymer, metals amongst others.

Typically, the MEMS structure requires a certain degree of translational freedom in order to perform its function. To this end, the MEMS structure is packaged such that the structure is located in a cavity. An example of such a package is for instance disclosed in Q. Li et al. in "Hermeticity and Thermal Stability Testing of PECVD Silicon Nitride Thin-Film Packages", ICEP 2008, International Conference on Electronics Packaging, 10 Jun. 2008, Tokyo, Japan.

Silicon nitride is a particularly suitable material for such capping layers because of its strength (it is for instance used as anti-scratch material for ICs).

However, this paper discloses that a problem with plasma-enhanced chemical vapor deposited silicon nitride capping layers is that the deposition leads to significant hydrogen contamination in the silicon nitride. This causes problems when the package is subsequently exposed to thermal budgets in further processing steps, such as thermal budgets of around 450° C. At these temperatures, the hydrogen contamination tends to be released from the silicon nitride capping layer, which compromises the vacuum inside the cavity, thus impairing the functioning of the microscopic structure. This seriously hampers the further processing of such devices.

FIG. 1 schematically depicts the build-up of pressure inside such a cavity exposed to a temperature of 450° C. as a function of time (min.). It can be predicted from FIG. 1 using a double exponential model that an excess pressure of around 9 mTorr will be generated by the outgassing of hydrogen from the silicon nitride capping layer. This problem is exacerbated at higher temperatures, as is shown in FIG. 2, where the asymptotic excess pressure in mTorr as a function of anneal temperature for a 300 nm thick PECVD silicon nitride is depicted.

SUMMARY OF THE INVENTION

The present invention seeks to provide a device according to the opening paragraph that is less prone to the build-up of such excess pressure.

The present invention further seeks to provide a method for forming such a device.

According to an aspect of the present invention, there is provided a device comprising a substrate carrying a microscopic structure in a cavity capped by a capping layer comprising a material of formula $SiN_xH_y$, wherein $x>1.33$ and $y>0$. It has been found that a silicon nitride capping layer with high carbon to hydrogen ratio is obtained when using a high density plasma in a plasma deposition tool. It has surprisingly been found that this limits the amount of hydrogen outgassing in subsequent processing steps at elevated temperatures, i.e. temperatures of 400° C. or higher, is significantly reduced. The invention has been based on the insight that the unavoidable incorporation of hydrogen in a silicon nitride layer, when typically grown from $SiH_4$ and $NH_3$ gas, is mainly incorporated in the form of N—H (covalent) bonds in this layer when the nitrogen content in this layer is maximized. Such bonds are stronger, i.e. more stable at the aforementioned high temperatures than other possibly present hydrogen-containing bonds such as H—H bonds, which are more predominantly present when the nitrogen content is lower.

Hence, the device having such a capping layer is less likely to suffer from deteriorated performance of the microscopic structure such as a micromachined device, e.g. MEMS device, due to the build-up of pressure in the cavity housing this structure. The capping material of the present invention distinguishes itself from stoichiometric silicon nitride in which $x=1.33$ and $y=0$ as well as from the known PECVD deposited nitrides in which $x<1.33$, typically around 1.1, with $y\approx0.5$.

In an embodiment, the cavity is formed in a further layer located in between the substrate and the capping layer. Such a layer may for instance be a dielectric material that has been etched to form the cavity therein. Examples include oxides such as $SiO_2$. However, other suitable materials, e.g. metals such as Al, or semiconductors such as Si may also be contemplated.

Preferably, the parameters in the material formula $SiN_xH_y$ are chosen such that $1.35 \leq x \leq 1.65$ and $0.2 \leq y \leq 0.8$. By controlling the values of x and y to lie within these ranges, outgassing of hydrogen upon exposure of the device to the aforementioned high temperatures is considerably reduced. It has been found that the best result is obtained when $x=1.5$ and $y=0.5$.

Such a device may be advantageously incorporated in an electronic apparatus such as a consumer electronics apparatus, a mobile communication apparatus, an automotive apparatus and so on.

In accordance with another aspect of the present invention, there is provided a method of forming such a device, comprising providing a substrate; forming a microstructure on said substrate; forming a patterned sacrificial material layer over the microstructure; depositing a capping layer over the patterned sacrificial material layer, said capping layer comprising a material of formula $SiN_xH_y$, wherein $x>1.33$ and $y>0$; patterning access holes in the capping layer; forming a cavity by removing at least a part of the patterned sacrificial material through said access holes, said cavity comprising the microstructure; and sealing said access holes.

Such a capping layer, which may be formed by using a high density plasma in a plasma deposition tool, has the advantage of limiting hydrogen outgassing in subsequent high-temperature processing steps as previously explained.

In an embodiment, the method further comprises the step of depositing a further sacrificial layer on the substrate prior to the formation of the microstructure, and wherein the step of forming the cavity further comprises removing at least a part of the further sacrificial layer through said access holes. This allows for the formation of undercuts underneath the layer used for defining the microscopic structure, e.g. MEMS structure, such that laterally extending microscopic structures may be formed.

BRIEF DESCRIPTION OF THE EMBODIMENTS

Embodiments of the invention are described in more detail and by way of non-limiting examples with reference to the accompanying drawings, wherein.

DETAILED DESCRIPTION OF THE DRAWINGS

Figure 1:
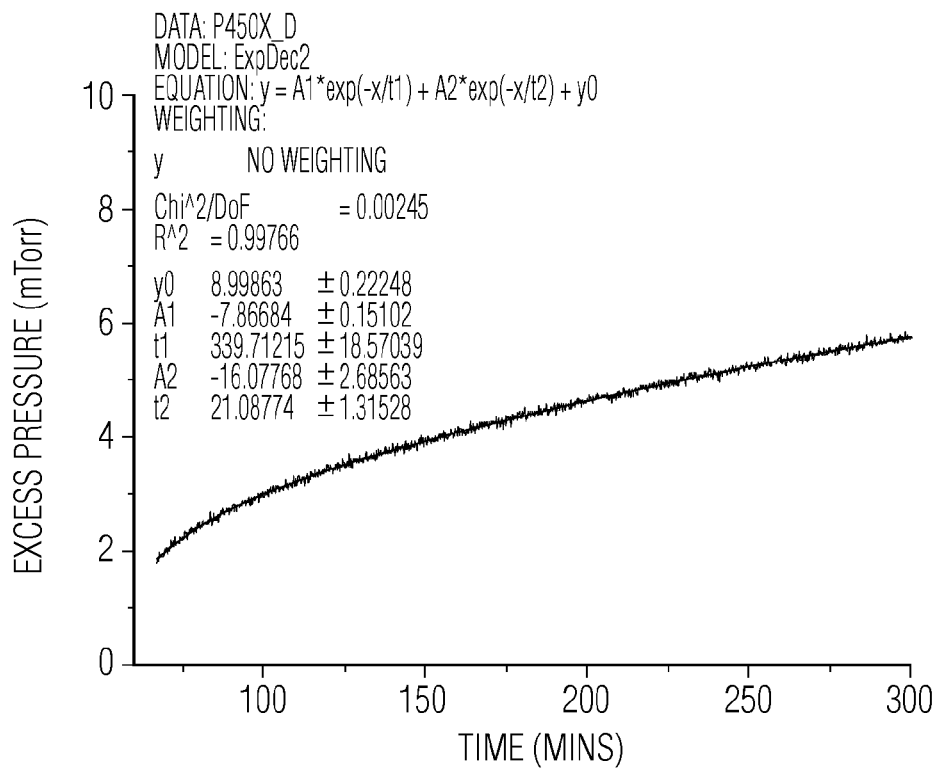
FIG. 1 depicts the excess pressure caused by the outgassing of a PECVD nitride layer at 450° C. as a function of time together with an asymptotic fit.

It should be understood that the Figures are merely schematic and are not drawn to scale. It should also be understood that the same reference numerals are used throughout the Figures to indicate the same or similar parts.

The present invention will now be described in further detail by means of a non-limiting example of a method for forming a device such as a MEMS device in which hydrogen outgassing from the capping layer is significantly reduced. The various steps of this method are shown in FIG. 3. In step (a), a substrate 10 is provided. This may be any suitable substrate. Non-limiting examples of suitable substrates include silicon substrates, silicon-on-insulator substrates, silicon-germanium substrates and so on. Other suitable example materials will be apparent to the skilled person. The substrate 10 may comprise further structures formed therein, e.g. implanted semiconductor structures such as transistors, diodes and so on. Such structures have not been explicitly shown for the sake of clarity only. The formation of such structures in a substrate 10 is well-known and will not be further elaborated on for reasons of brevity only.

In step (b), which is an optional step, a layer of a sacrificial material 12 is deposited over the substrate 10. Such a deposition may be achieved in any suitable manner, e.g. by means of a chemical vapor deposition process, which may be plasma-enhanced. Other deposition techniques are equally feasible. In the context of the present invention, a sacrificial material is a material that deposited for the purpose of at least partial removal in a subsequent process step, e.g. for forming a cavity inside the overall structure of the device. Such removal may be achieved in any suitable manner, e.g. by etching or thermal decomposition. Any material that is commonly used in e.g. semiconductor processing for such purposes may be contemplated. The choice of the sacrificial material 12 is not essential to the teachings of the present invention.

In step (c), a further layer 14 is deposited either over the substrate 10 in case of the absence of the sacrificial material 12 or over the sacrificial material 12 otherwise. Such a deposition may be achieved in any suitable manner, e.g. by means of a chemical vapor deposition process, which may be plasma-enhanced. Other deposition techniques are equally feasible. The further layer 14 is patterned in step (d) to form the microscopic structures 15, e.g. MEMS devices in patterned further layer 14'. Any suitable material may be used for the further layer 14, e.g. silicon oxide, polysilicon, mono-Si, Al, Cu, TiN, $Si_3N_4$ and so on. The further layer 14 may be patterned in any suitable manner, e.g. by means of isotropic or anisotropic etching, which may be a dry or wet etch.

The patterned further layer 14' including the microscopic structures 15 is subsequently covered by a further sacrificial layer 16, which again may be deposited in any suitable manner. Examples of suitable deposition techniques have already been given. The further sacrificial layer 16 may be the same material as the sacrificial layer 12, or may be a different material. Preferably, the sacrificial layer 12 and the further sacrificial layer 16 may be at least partially removed in a single processing step to limit the number of required processing steps. The further sacrificial layer 16 may be patterned in any suitable manner, e.g. by etching as shown in step (f) to form a patterned further sacrificial layer 16'.

In step (g), which is the step defining the inventive contribution over the prior art, a capping layer 18 is deposited over the patterned sacrificial layer 16'. The capping layer 18 is a silicon nitride layer having a structural formula of $SiN_xH_y$, in which x>1.33 and y>0. It has been found that by ensuring that the nitrogen content in the nitride is in excess of 1.33 in the aforementioned structural formula, the outgassing of hydrogen from the capping layer 18 upon exposure to subsequent thermal budgets, e.g. annealing steps performed at 400° C. or higher is significantly reduced, such that the build-up of pressure in the cavity surrounding the microscopic structure(s) 15 is largely avoided (vide infra).

Figure 2:
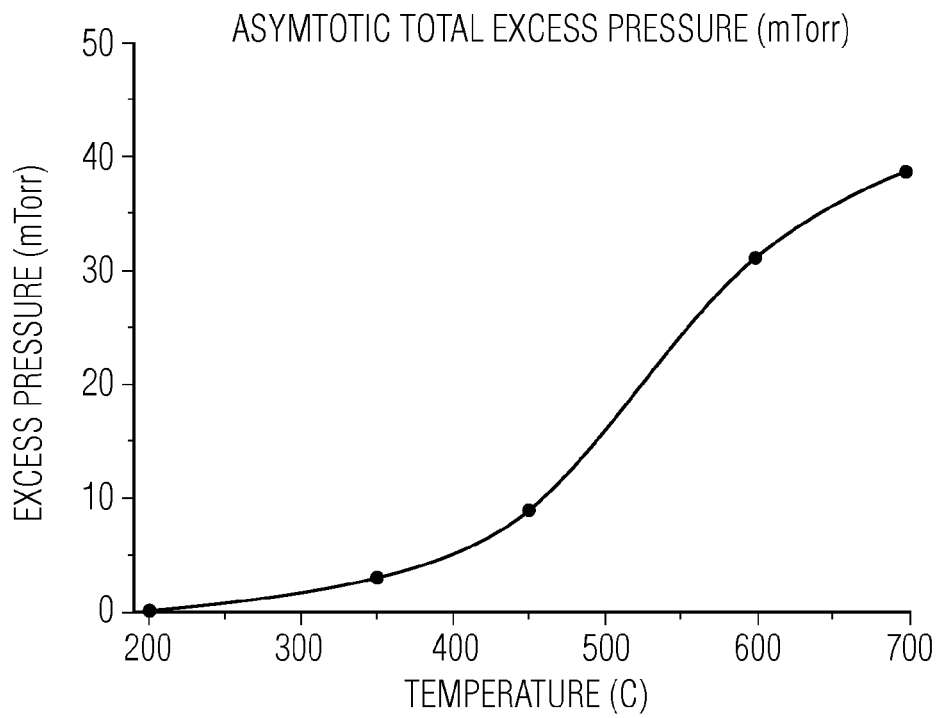
FIG. 2 depicts the asymptotic total pressure in mTorr as a function of anneal temperature for a 300 nm thick PECVS nitride layer.
Figure 3A:
FIG. 3 schematically depicts an exemplary embodiment of the method of the present invention.
Figure 3B:
Figure 3C:
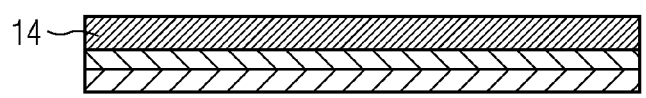
Figure 3D:
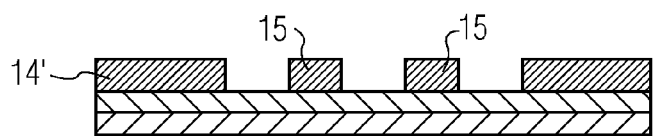
Figure 3E:
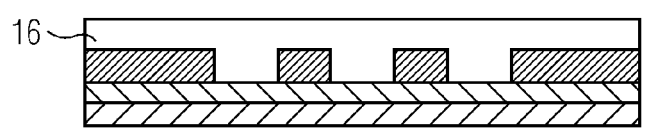
Figure 3F:
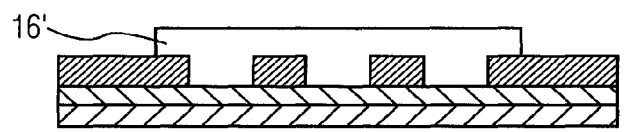
Figure 3G:
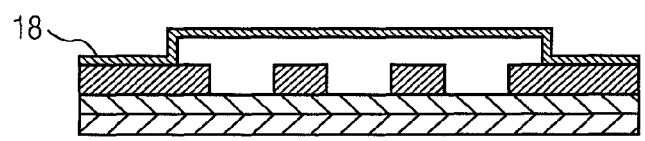
Figure 3H:
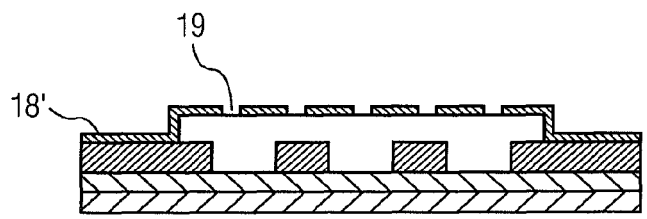
Figure 3I:
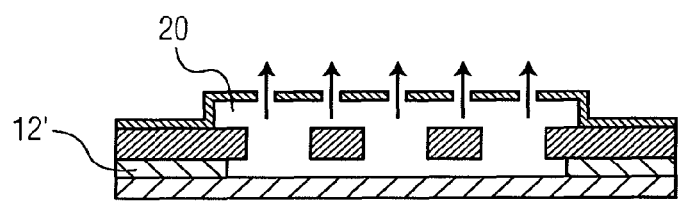
Figure 3J:
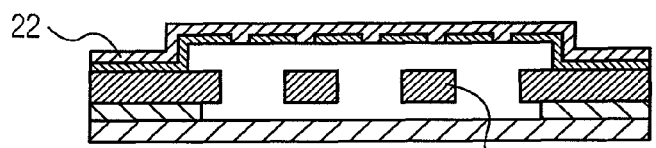

The best results are obtained if the value of x is chosen to be 1.5 and the value of y is chosen to be 0.5, i.e. the structural formula of the material is $SiN_{1.5}H_{0.5}$. The results do not significantly deteriorate as long as the values of x and y are chosen inside the following interval; $1.35 \leq x \leq 1.65$ and $0.2 \leq y \leq 0.8$. The definition of these intervals has been based on the typical variations in process parameters that occur when attempting to produce a nitride material of structural formula $SiN_{1.5}H_{0.5}$. Experiments (not shown) have demonstrated that for such a nitride layer having a thickness of 500 nm, the asymptotic outgassing levels were less than 0.5 mTorr at a temperature of 450° C., which is around a factor 20 lower than the outgassing levels for a 300 nm PECVD nitride layer, as shown in FIG. 2.

In an embodiment, the nitride material used to form the capping layer 18 of the device of the present invention is formed in a plasma deposition tool using a high density plasma. In the context of the present invention, a high density plasma is a plasma having a pressure of at least 10 Pa. Preferably, the pressure is in the range of 10-1000 Pa.

In step (h), the capping layer 18 is patterned to form a patterned capping layer 18', in which openings 19 are formed to facilitate the removal of at least some of the sacrificial material(s) formed underneath the capping layer. Such hole may be formed in any suitable manner, e.g. by means of an etching step. Such hole formation is known per se and is therefore not further explained for reasons of brevity. In step (i), at least some of the further sacrificial material 16 and, if present, some of the sacrificial material 12 is removed as indicated by the vertical arrows, e.g. by etching or thermal decomposition in case of these materials being thermally decomposable polymers, to form the cavity 20 housing the microscopic device(s) 15. The process is completed by sealing the holes 19 with any suitable sealing layer 22, thus yielding an example embodiment of the device of the present invention.

It should be understood that the method described in FIG. 3 is a non-limiting example of the present invention. Many variations may be contemplated, such as the inclusion of additional layers in between the substrate 10 and the capping layer 18, as well as the addition of further structures over the capping layer 18 and sealing layer 22. It should further be understood that the cavity 20 may comprise any type of microscopic device 15.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A device comprising: a substrate carrying a micromachined device in a cavity capped by a capping layer including a material of formula $SiN_xH_y$, wherein $1.35 \leq x \leq 1.65$ and $0.2 \leq y \leq 0.8$.

2. The device of claim 1, wherein the cavity is formed in a further layer located in between the substrate and the capping layer.

3. The device of claim 1, wherein the micromachined device is a MEMS (micro-electro-mechanical systems) structure.

4. The device of claim 1, wherein $x=1.5$ and $y=0.5$.

5. An electronic apparatus comprising the device of claim 1.

6. The device of claim 1, further including a sacrificial layer having at least a portion that has been removed from within the cavity.

7. The device of claim 1, wherein the capping layer includes one or more openings into the cavity.

8. The device of claim 7, further including a sealing layer that fills the one or more openings.

9. The device of claim 1, wherein the capping layer is around 500 nm thick and has asymptotic outgassing levels that are less than 0.5 mTorr at 450° C.

10. A method of forming the device of claim 1, comprising:
providing a substrate;
forming a micromachined device on said substrate;
forming a patterned sacrificial material layer over the micromachined device;
depositing a capping layer over the patterned sacrificial material layer, said capping layer comprising a material of formula $SiN_xH_y$, wherein $1.35 \leq x \leq 1.65$ and $0.25 \leq y \leq 0.8$;
patterning a plurality of access holes in the capping layer;
forming a cavity by at least removing at least a part of the patterned sacrificial material through said access holes, said cavity comprising the micromachined device; and
sealing said access holes.

11. The method of claim 10, wherein the step of depositing the capping layer comprises depositing said material by plasma deposition using a high density plasma.

12. The method of claim 10, further comprising the step of depositing a further sacrificial layer on the substrate prior to the formation of the micromachined device, and wherein the step of forming the cavity further comprises removing at least a part of the further sacrificial layer through said access holes.

13. The method of claim 10, wherein the micromachined device is a MEMS (micro-electro-mechanical systems) structure.

14. The method of claim 10, wherein the capping layer material is configured to produce asymptotic out gassing levels that are less than 0.5 mTorr at 450° C., for a capping layer of about 500 nm in thickness.

15. The method of claim 10, wherein the step of depositing a capping layer material is carried out to produce the capping layer with a thickness of around 500 nm.

16. A device comprising:
a substrate; and
a structure located on the substrate and configured and arranged to form a cavity that is subject to outgassing levels of less than 1.0 mTorr at 450° C., the structure including
a capping layer forming a cavity between the substrate and the capping layer,
a sacrificial layer extending over the substrate and beneath the capping layer, wherein at least a portion of the sacrificial layer is removed from the cavity, and
a further layer extending over the sacrificial layer and beneath the capping layer, the further layer including one or more microscopic mechanical devices.

17. The device of claim 16, wherein the capping layer is made from a material of formula $SiN_xH_y$, wherein $1.35 \leq x \leq 1.65$ and $0.2 \leq y \leq 0.8$.

* * * * *